(12) United States Patent
Mitomori

(10) Patent No.: US 7,237,916 B2
(45) Date of Patent: Jul. 3, 2007

(54) ELECTRONIC DEVICE HAVING HALF MIRROR ON FRONT FACE

(75) Inventor: Yasuo Mitomori, Takefu (JP)

(73) Assignee: Orion Electric Co., Ltd., Fukui (JP)

( * ) Notice: Subject to any disclaimer, the term of this patent is extended or adjusted under 35 U.S.C. 154(b) by 82 days.

(21) Appl. No.: 11/166,249

(22) Filed: Jun. 27, 2005

(65) Prior Publication Data

US 2006/0001976 A1    Jan. 5, 2006

(30) Foreign Application Priority Data

Jun. 30, 2004    (JP)    ............... 2004-194243

(51) Int. Cl.
 *G02B 7/182*    (2006.01)
(52) U.S. Cl. ............... 359/871; 359/877; 349/60
(58) Field of Classification Search ............... 359/848, 359/871, 877; 174/366, 367; 200/511; 338/114; 361/220, 287, 290, 291; 349/60
See application file for complete search history.

(56) References Cited

U.S. PATENT DOCUMENTS

2004/0012730 A1* 1/2004 Pan et al. ............... 349/60

FOREIGN PATENT DOCUMENTS

| JP | 2000-106297 A | 4/2000 |
| JP | 2001-042426 A | 2/2001 |
| JP | 2001-100233 | 4/2001 |
| JP | 2003-185815 A | 7/2003 |

OTHER PUBLICATIONS

European Search Report of EP05253952 dated Apr. 27, 2006.
European Search Report dated Nov. 23, 2006 issued in corresponding European Application No. 05253952.5.

* cited by examiner

*Primary Examiner*—Hung Xuan Dang
*Assistant Examiner*—Joseph Martinez
(74) *Attorney, Agent, or Firm*—Westerman, Hattori, Daniels & Adrian, LLP.

(57) ABSTRACT

The invention provides a method for preventing a half mirror used as a decorative panel of an electronic device from being burned by charged static electricity and having deteriorated appearance, by providing a practical method for providing a ground connection of the half mirror using a soft elastic conductive member to prevent the half mirror from being damaged and to enable easy connection with a rough size accuracy. An electronic device comprises a conductive chassis and a half mirror constituting at least a portion of a decorative panel formed on a front face thereof, wherein an elastic conductive member compressed between a vapor deposited layer formed to an inner surface of the half mirror and a contact surface of the chassis is arranged so that a static electricity charged in the half mirror is conducted via the elastic conductive member toward the conductive chassis.

6 Claims, 7 Drawing Sheets

(a)

(b)

ELECTRONIC DEVICE HAVING HALF MIRROR ON FRONT FACE

The present application is based on and claims priority of Japanese patent application No. 2004-194243 filed on Jun. 30, 2004, the entire contents of which are hereby incorporated by reference.

BACKGROUND OF THE INVENTION

1. Field of the Invention

The present invention relates to a half mirror used in a decorative panel of an electronic device, and more specifically, to an art for preventing the deterioration of appearance of the half mirror caused by a vapor deposited layer of the half mirror being burned by static electricity charged in the half mirror.

2. Description of the Related Art

Heretofore, a half mirror used as a decorative panel disposed on a front face of an electronic device is equipped with a metallic electric conductor functioning as earth to prevent static electricity from being charged in the half mirror. However, to prevent the half mirror from being damaged (scratched) by the hard metallic conductor being in direct contact therewith, it is popular to provide a narrow gap therebetween to create a pseudo-connection. However, if the gap is too narrow, the half mirror may still be scratched, but if the gap is too wide, the potential of the static electricity being charged in the half mirror increases, by which the energy of discharge to the metallic conductor becomes too strong, causing even greater burn of the vapor deposited layer of the half mirror and deteriorating the quality of the half mirror as decorative panel.

Japanese Patent Application Laid-Open Publication No. 2003-185815 (patent document 1) discloses one example of such an electronic device. Patent document 1 discloses, as illustrated in FIG. 6, an art of adhering a metallic tape 60 with a conductive paste 32 on a vapor deposited layer 21 of a half mirror 20, and arranging a conductive member 61 between a conductive chassis 40, thereby conducting the static electricity charged in the half mirror 20 via the metallic tape 60 and the conductive member 61 to the conductive chassis 40. Further, a method is disclosed to realize conduction by having the conductive member 61 connected to the conductive chassis 40 come in contact with the vapor deposited layer 21 of the half mirror 20, as illustrated in FIG. 7.

According to the prior art disclosed above, a metallic conductor is used as an earth to prevent static electricity from being charged in the half mirror used in the decorative panel on the front face of an electronic device, but a narrow gap is provided therebetween to realize pseudo-connection, so as to prevent the hard metallic conductor from damaging the hard mirror through direct connection. However, if the gap is too narrow, the half mirror may still be damaged, and if the gap is too wide, the potential of the static electricity being charged in the half mirror increases, by which the energy of discharge to the metallic conductor becomes too strong, causing even further burn of the vapor deposited layer of the half mirror and deteriorating the quality of the half mirror as the decorative panel. Therefore, the size of the metallic conductor must be strictly managed in order to reduce the variation in the size of the gap (distance) created between the vapor deposited layer of the half mirror and the metallic conductor. Moreover, the metallic conductor disposed near the vapor deposited layer of the half mirror must have very small surface roughness, and the assembling of the conductor must be carried out carefully so as not to create any scratches or bumps on the vapor deposited surface of the half mirror.

Moreover, as shown in FIG. 6, patent document 1 discloses a half mirror having a metallic tape 60 with conductive paste attached to a vapor deposited layer 21 of the half mirror, and further having a conductive member 60 disposed between the conductive chassis 40, to thereby conduct the static electricity charged in the half mirror 20 via the metallic tape 60 and the conductive member 61 to the conductive chassis 40. According to this technique, the half mirror 20 and the conductive chassis 40 are not directly connected by the metallic tape 60, but with a conductive member 61 additionally disposed. Therefore, the position for adhering the metallic tape 60 is restricted to the location in which the conductive member 61 is positioned between the conductive chassis 40 and the half mirror 20, which is a difficult condition to fulfill considering the arrangement of components in recent electronic devices having minimum capacity inside the electronic devices. Furthermore, a very strict accuracy in size is required to maintain a constant connection through the arrangement of the half mirror 20, the metallic tape 60 and the conductive member 61, and very careful assembly work is required in assembling the electronic device, by which the work efficiency is deteriorated. On the other hand, as illustrated in FIG. 7, a method is disclosed for realizing conduction by having a conductive member 61 in contact with the conductive chassis 40 being in direct contact with the vapor deposited layer 21 of the half mirror 20, but it is disclosed in the patent document that this arrangement requires means to prevent the vapor deposited layer from being scratched by the conductive member, such as by specially designing the shape of the conductive member.

SUMMARY OF THE INVENTION

The present invention provides a half mirror used as a decorative panel of an electronic device having a means for preventing the vapor deposited layer of the half mirror from being burned by the static electricity charged in the half mirror and thereby preventing deterioration of the appearance of the electronic device. Specifically, the present invention aims at providing a practical ground connection means for ground connecting a half mirror by using a soft elastic conductive member as the electric conductor, thereby preventing the half mirror from being damaged by the hard metallic electric conductor, and modifying the mechanical processing accuracy of the contact portion required when using a metallic conductor, by utilizing the soft conductor capable of realizing connection with a rough size accuracy.

A first aspect of the present invention relates to an electronic device having a half mirror on a front face comprising a conductive chassis for mounting various electronic components; a decorative panel disposed on a front face of the chassis, at least a portion of the decorative panel formed of a half mirror; an elastic conductive member compressed between and in contact with a vapor deposited layer formed on an inner side of the half mirror and a contact surface of the chassis, the elastic conductive member arranged so that a static electricity charged in the half mirror is conducted via the elastic conductive member to the elastic conductive member, and wherein the area ratio of the elastic conductive member to the half mirror is approximately 5% or greater, preferably 9% or greater.

According to the first aspect of the present invention, the electronic device is equipped with a conductive chassis for mounting various electronic components, and a decorative panel disposed on the front face of the chassis. Further, a portion of the decorative panel is formed of a half mirror, and a soft elastic conductive member is disposed in compressed state between a vapor deposited layer formed on an inner side of the half mirror and a contact surface of the chassis, so that by the repulsive force of the compressed elastic conductive member, the vapor deposited layer of the half mirror and the contact surface of the chassis can be connected without fail. Thus, the static electricity charged in the half mirror can be conducted via the elastic conductive member to the conductive chassis, so that the burning of the vapor deposited layer of the half mirror can be prevented, and since a soft elastic conductive member is used, the half mirror or the vapor deposited layer will not be damaged (scratched). Moreover, by setting the area ratio of the elastic conductive member to the half mirror to approximately 5% or greater, preferably 9% or greater, the conductivity required to conduct the static electricity charged in the half mirror to the conductive chassis can be ensured in proportion to the size of the half mirror, and thus, the burning of the vapor deposited layer of the half mirror can be prevented without fail.

A second aspect of the present invention relates to an electronic device having a half mirror on a front face according to the first aspect, wherein the decorative panel has a through hole for the elastic conductive member and a guide panel projecting from the through hole toward the chassis, wherein the guide panel is formed of a pair of left and right side walls for supporting left and right sides of the elastic conductive member and an upper wall projected longer toward the chassis than the side walls, and wherein the elastic conductive member passed through the through hole is adhered to the vapor deposited layer of the half mirror via a conductive two-sided adhesive tape or a conductive adhesive paste.

According to the second aspect of the present invention, a through hole for inserting the elastic conductive member is formed to the decorative panel, and a guide panel projected from the through hole toward the chassis along the direction of insertion of the elastic conductive member is provided, wherein the guide panel includes a pair of left and right side walls for supporting the sides of the elastic conductive member and an upper wall projected longer toward the chassis than the side walls, thereby enabling the elastic conductive member to be pinched at the side wall area and inserted to the through hole using the guide panel as a positioning guide, with the guide panel preventing the elastic conductive member from being displaced in the vertical or horizontal direction. Furthermore, the end of the elastic conductive member is adhered securely to the vapor deposited layer of the half mirror by a conductive two-sided adhesive tape or a conductive adhesive paste.

A third aspect of the prevent invention relates to an electronic device having a half mirror on a front face according to the first or second aspect, wherein the contact surface is composed of a conductive mounting panel formed either integrally with the chassis or separately from the chassis and connected thereto, the mounting panel capable of mounting an electronic component such as an external connecting terminal, and wherein the elastic conductive member is pressed against the mounting panel to conduct the static electricity charged in the half mirror to the conductive chassis.

According to the third aspect, the contact surface is composed of a conductive mounting panel formed either integrally with the chassis or separately from the chassis and connected thereto, the mounting panel capable of mounting an electronic component such as an external connecting terminal, and the elastic conductive member is pressed against the contact surface of the mounting panel to thereby conduct the static electricity charged in the half mirror to the conductive chassis. Furthermore, the mounting panel having conductivity serves as the mounting panel for mounting electronic components such as the external terminal of the electronic device, so a portion of the mounting panel can be utilized as the contact surface.

A fourth aspect of the present invention relates to an electronic device having a half mirror on a front face according to the third aspect, wherein when the elastic conductive member is pressed against the mounting panel, it is arranged to partially overhang from an end of the mounting panel, and a compressed end of the compressed elastic conductive member is positioned in an inner side of the electronic device from the mounting panel.

According to the fourth aspect of the invention, the elastic conductive member is disposed so that when it is pressed against the mounting panel, it is partially overhung from an end of the mounting panel, so that the overhang portion of the compressed elastic conductive member is not in the range of the contact surface and thus not compressed. Therefore, when the elastic conductive member is compressed by the mounting panel, the area in contact with the contact surface is compressed but the overhang area is not compressed, so that the overhang portion is deformed in an arc shape and expanded toward a specific direction. Since the upper wall of the guide panel is positioned in the area toward which the overhang portion is deformed in an arc shape, the deformed portion is blocked by the upper wall which prevents further deformation. Thus, the elastic conductive member is prevented from being deformed in an unspecific direction and coming into contact with the external connecting terminal disposed close to the contact surface on the mounting panel. Furthermore, the overhang portion of the elastic conductive member which is not compressed by the contact surface looks swollen. Since this portion is positioned in an inner side of the electronic device from the mounting panel, it is possible to estimate how much the elastic conductive member is compressed by visually confirming the size of the swollen portion. Therefore, it is possible to easily determine whether the conductive member is suitably compressed or not by visual observation.

DETAILED DESCRIPTION OF THE PREFERRED EMBODIMENTS

Now, the preferred embodiments for carrying out the present invention will be described with reference to FIGS. 1 through 4. The technical scope of the present invention is not restricted to the language used in the embodiments, but is extended to the range in which a person skilled in the art could easily substitute based on the present disclosure.

Figure 1:
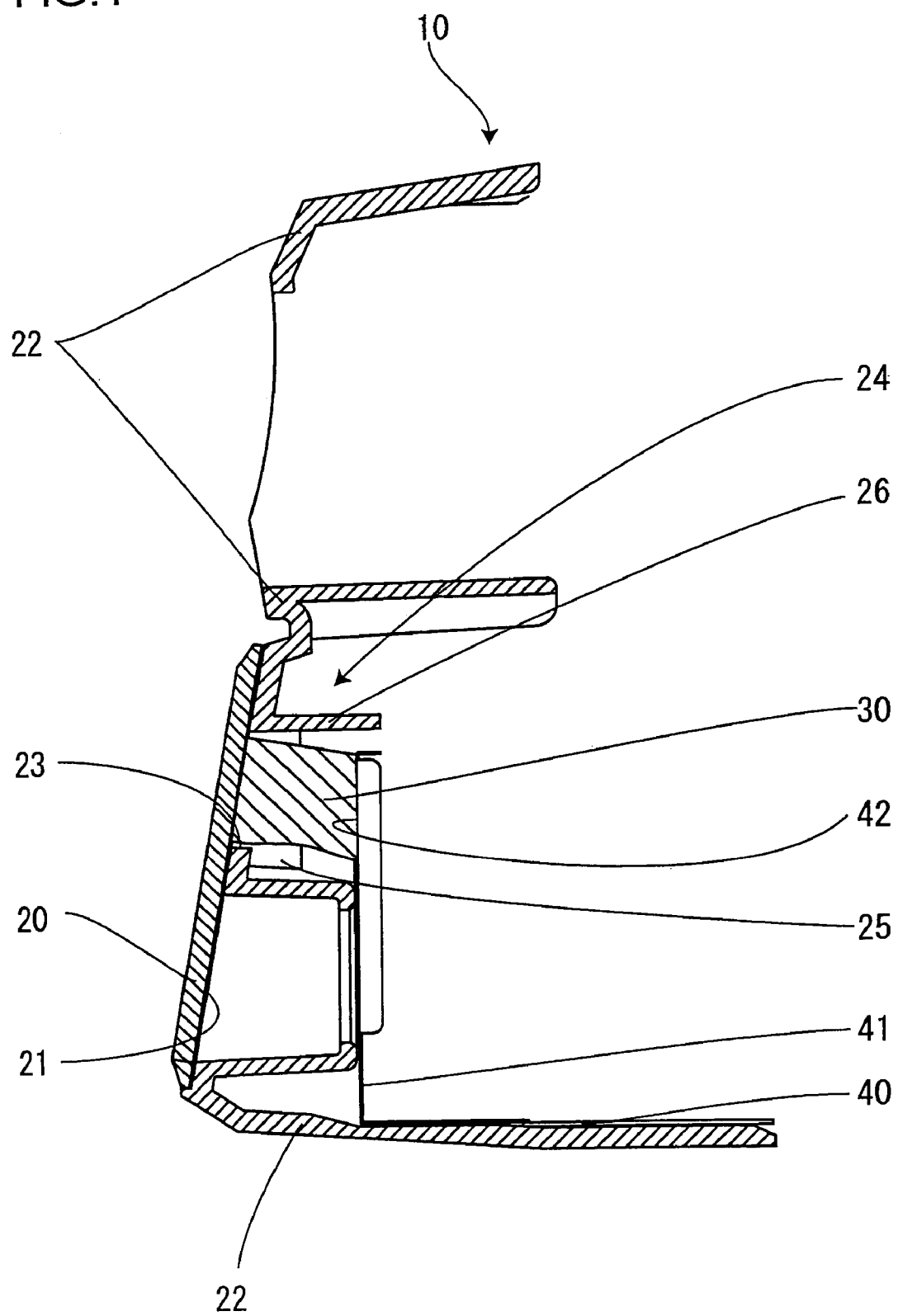
FIG. 1 is an explanatory cross-sectional view showing the schematic arrangement of a method for conducting a half mirror and a conductive chassis via an elastic conductive member according to a first embodiment of the present invention.

FIG. 1 is an explanatory cross-sectional view showing a schematic structure of a method for conducting a half mirror and a conductive chassis via an elastic conductive member according to the first embodiment of the invention.

With reference to FIG. 1, we will explain the structure for providing a ground connection from a half mirror 20 to a conductive chassis 40 so as to prevent static electricity from being charged in the half mirror 20 constituting a part of a decorative panel. The conductive chassis 40 is a metallic panel for mounting a circuit wiring board (not shown) and the like, having an electronic component 50 which is an external connecting terminal such as a jack terminal arranged on a wall surface formed by bending a portion of the conductive chassis upward, and a contact surface 42 to be in contact with an elastic conductive member 30 is arranged on the wall surface of the conductive chassis 40. The elastic conductive member 30 is a conductor for connecting the vapor deposited layer 21 of the half mirror 20 and the conductive chassis 40 when assembled to the electronic device 10, and is designed to have a length somewhat longer than the distance between the half mirror 20 and the conductive chassis 40. Since the elastic conductive member 30 disposed between the vapor deposited layer 21 and the conductive chassis 40 is compressed, the compressed elastic conductive member 30 comes into contact by repulsive force with the vapor deposited layer 21 and the contact surface 42 on the conductive chassis 40 via plane contact, thus realizing a secure conduction. Therefore, there is no need to strictly control the length of the elastic conductive member 30, as long as it is longer than the distance between the vapor deposited layer and the chassis. Furthermore, the elastic conductive member 30 is inserted to and supported by a through hole 23 formed to the decorative panel 22 of the electronic device 10, wherein one end of the elastic conductive member 30 exposed from both ends of the through hole 23 is in contact with and pressed against the vapor deposited layer 21 of the half mirror 20, and the other end of the elastic conductive member 30 being exposed through the through hole 23 is in contact with and pressed against the contact surface 42 of the conductive chassis 40 disposed inside the electronic device 10. Thereby, the vapor deposited layer 21 of the half mirror 20 can be conducted without fail to the conductive chassis 40 on the ground side via the elastic conductive member 30, and the static electricity charged in the half mirror 20 can be conducted to the conductive chassis 40, by which the half mirror 20 is prevented from being charged with static electricity, and thus the burning of the vapor deposited layer 21 of the half mirror 20 is prevented.

Figure 2:
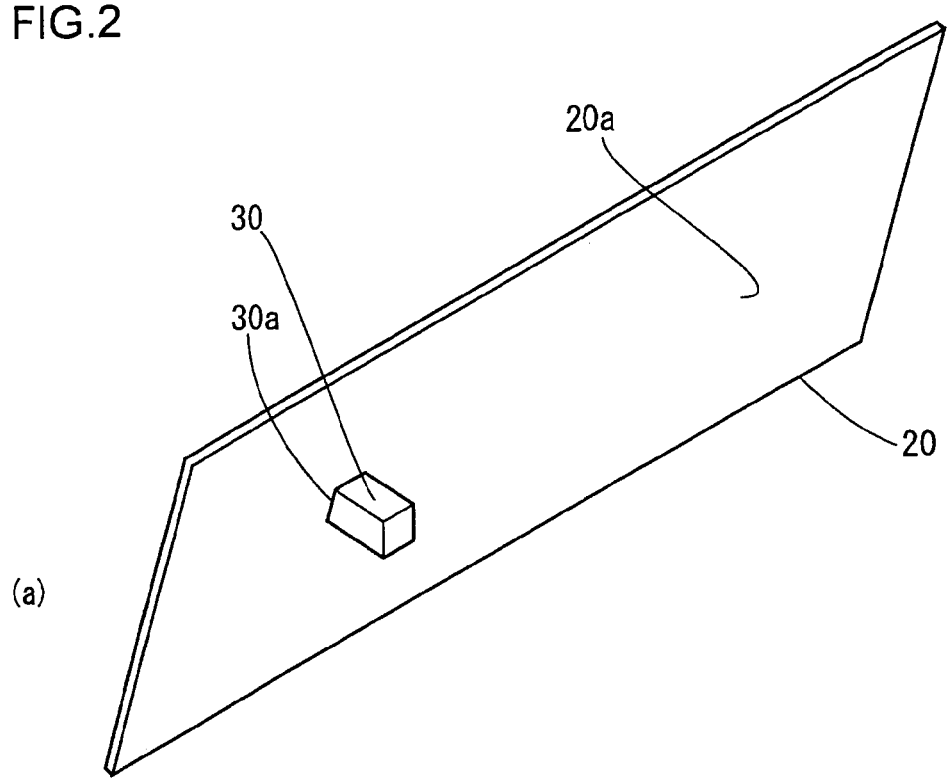
FIG. 2 is an explanatory view showing the relationship between the area of the half mirror and the cross-sectional area of the elastic conductive member according to the present invention.
Figure 2:
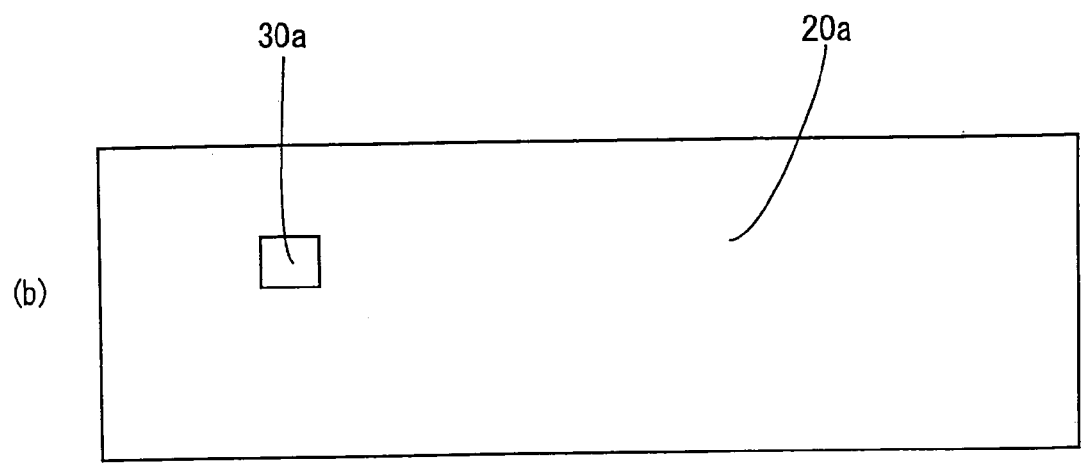

Next, FIG. 2 is an explanatory view showing the relationship between the area of the half mirror and the cross-sectional area of the elastic conductive member.

We will now describe the method for effectively conducting the static electricity charged in the half mirror 20 to the conductive chassis 40 without fail, with reference to FIG. 2. In FIG. 2, 20a refers to a planar area of the half mirror 20, and 30a refers to a cross-sectional area of the elastic conductive member 30. The static electricity charged in the half mirror 20 increases in proportion to the planar area of the half mirror 20, so in order to effectively conduct the charged static electricity to the conductive cassis without fail, it is important that the elastic conductive member 30 has sufficient conductivity, which is greatly influenced by the size of the cross-sectional area 30a of the elastic conductive member 30. Based on these points, according to the present invention, the area ratio x percent of the cross-sectional area 30a of the elastic conductive member 30 to the planar area 20a of the half mirror 20 can be expressed by the relational expression x percent=(30a/20a)×100. Experiments were conducted using various area ratios (x percents) to confirm the degree of burn occurring to the vapor deposited layer 21 of the half mirror 20 by the charge of static electricity, the result of which is shown in Table 1. In Table 1 showing the degree of generated burn in the vapor deposited layer, the degree of burn is represented by symbols, wherein P shows that a burn was generated, M shows that a slight burn was seen and G shows that no burn was seen.

TABLE 1

| AREA RATIO | EFFECT OF PREVENTING BURN |
| --- | --- |
| 12.0% | G |
| 9.0% | G |
| 6.0% | G |
| 5.7% | G |
| 5.5% | M |
| 5.0% | M |
| 3.0% | P |

As shown in Table 1, experiments were conducted with the area ratio x set to 12%, 9%, 6% and 3%. As a result, from x=12% through x=6%, the cross-sectional area 30a of the elastic conductive member 30 was sufficiently large, and no burn was seen in the vapor deposited layer 21 of the half mirror 20. However, in x=3% where the cross-sectional area was small, generation of a burn was confirmed. Next, when x=5%, a burn due to charge of static electricity was confirmed though the degree of the burn was moderate, and when x=5.5%, a very slight burn was confirmed in the vapor-deposited layer 21 of the half mirror 20. Next, when x=5.7%, no burn was seen in the vapor deposited layer 21. From the results described above, the relationship between the half mirror 20 and the elastic conductive member 30 should be set so that the ratio of the cross-sectional area of the elastic conductive member 30 to the planar area of the half mirror 20 should be equal to or greater than x=5%, by which the burn of the vapor deposited layer 21 is reduced greatly, and if x is at least 5.7%, it is possible to prevent the deterioration of the half mirror 20 by the burning of the vapor deposited layer 21. In consideration of the assembly error or the manufacture error of the elastic conductive member 30, it is preferable that x equals 9% or greater.

Figure 3:
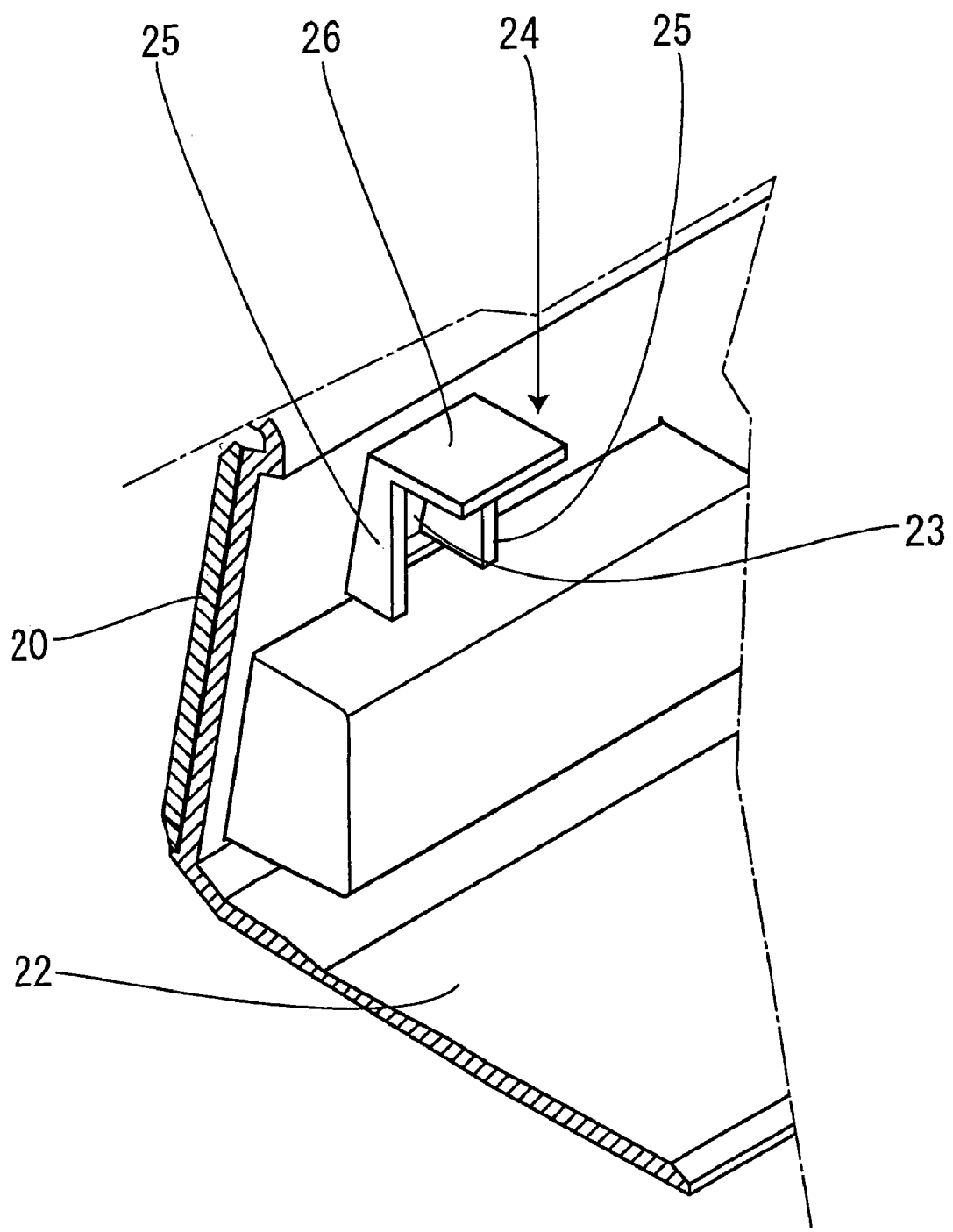
FIG. 3 is a perspective view showing a through hole and a guide panel formed to a decorative panel according to a second embodiment of the present invention.

Next, the second embodiment according to the present invention will be described. FIG. 3 is a perspective view showing the through hole and a guide panel provided on a decorative panel through which the elastic conductive member is inserted and supported.

A through hole 23 for the elastic conductive member 30 is formed to the decorative panel 22, and the decorative panel 22 further has a guide panel 24 projected toward the chassis 40 from the through hole 23. The guide panel 24 has left and right side walls 25 for supporting the left and right sides of the elastic conductive member 30, and an upper wall 26 projected further toward the chassis 40 than the side walls 25. Thus, it becomes possible to pinch using fingers the elastic conductive member 30 from the sides corresponding to the side walls 25, and to insert the member 30 to the hole using the upper wall as a positioning plate defining the vertical position and using the side walls 25 as positioning plates defining the horizontal position. Thus, the assembly work related to inserting the elastic conductive member 30 to the through hole 23 on the decorative plate 22 is facilitated.

Next, a preprocessing for adhering the elastic conductive member to the half mirror and a method for adhering the member to the vapor deposited layer on the half mirror are described with reference to FIGS. 4 and 5.

Figure 4:
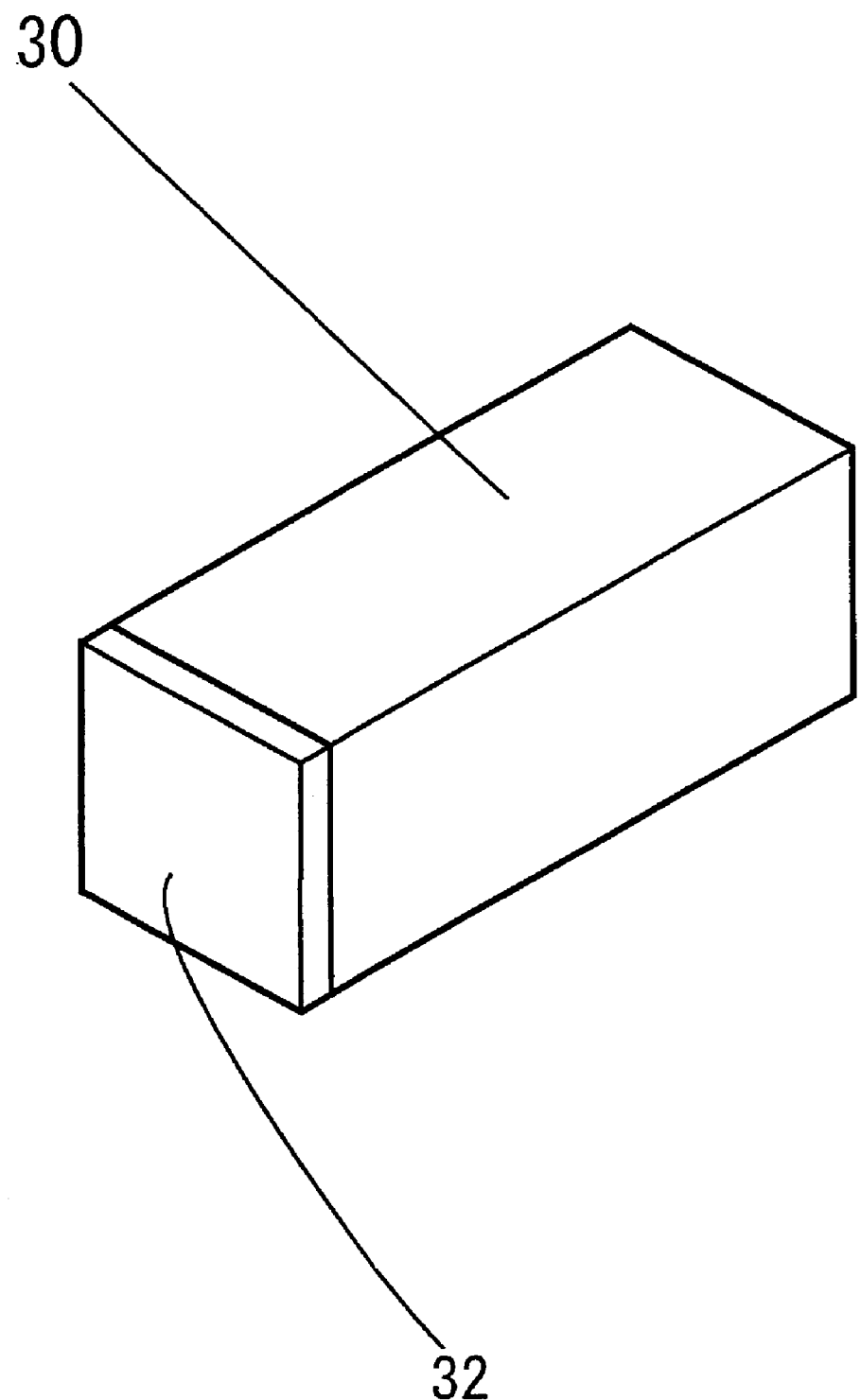
FIG. 4 is a perspective view showing the arrangement of the elastic conductive member adhered to the half mirror according to the second embodiment of the present invention.
Figure 5:
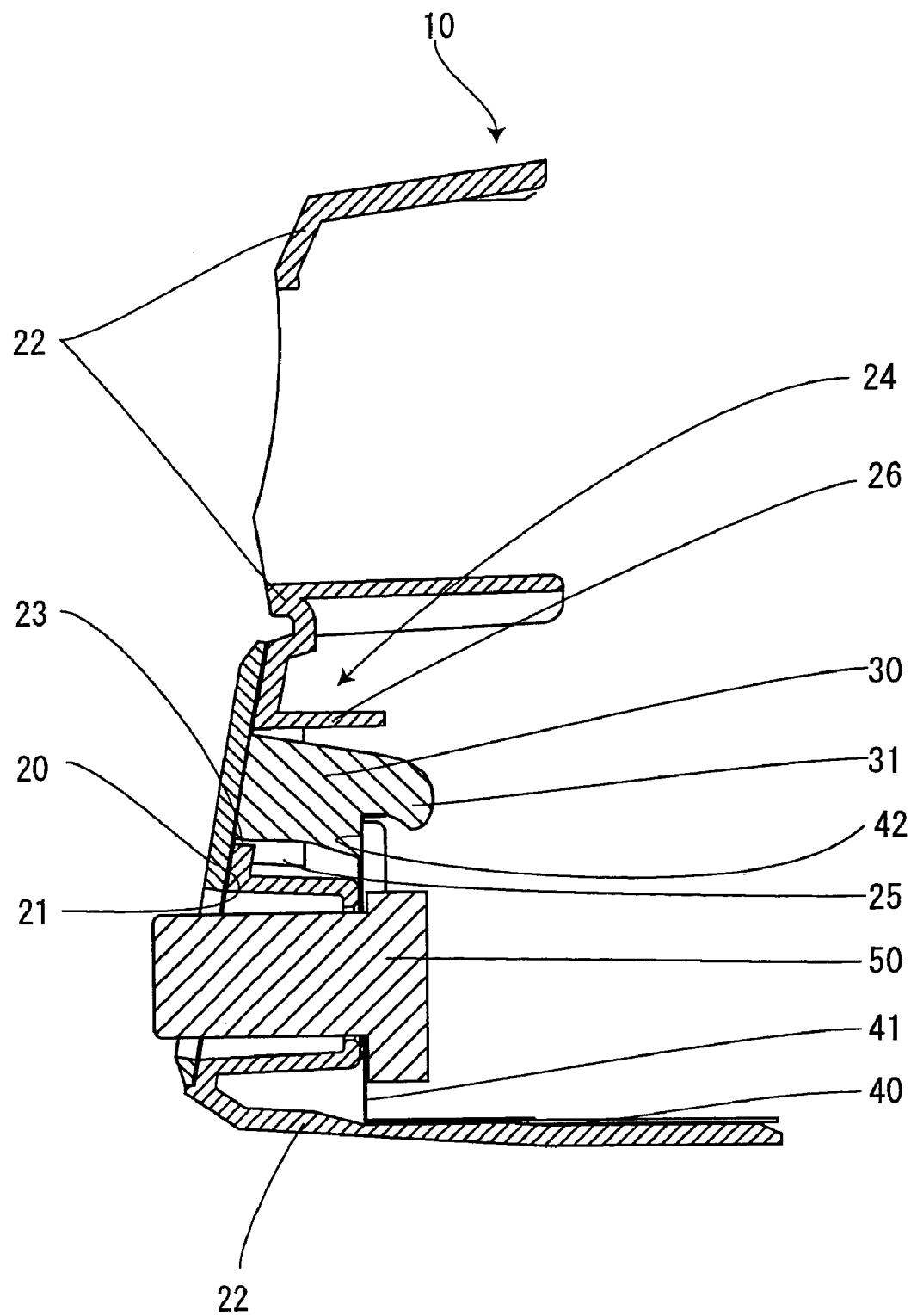
FIG. 5 is a cross-sectional view showing a method for conducting a half mirror and a conductive mounting panel according to the second embodiment of the present invention.
Figure 6:
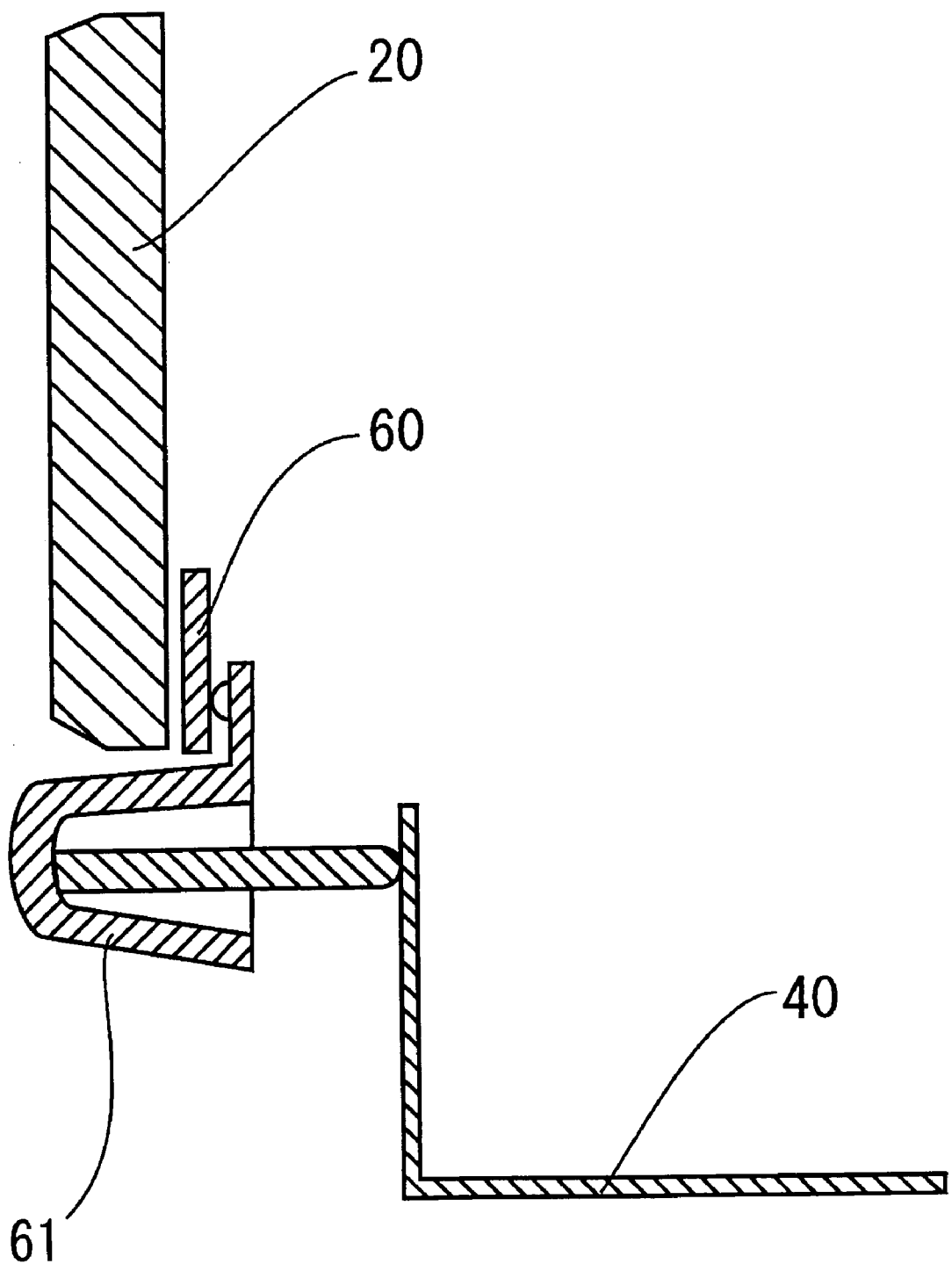
FIG. 6 is an explanatory view showing a prior art conduction method in which a metallic tape is adhered to the half mirror.
Figure 7:
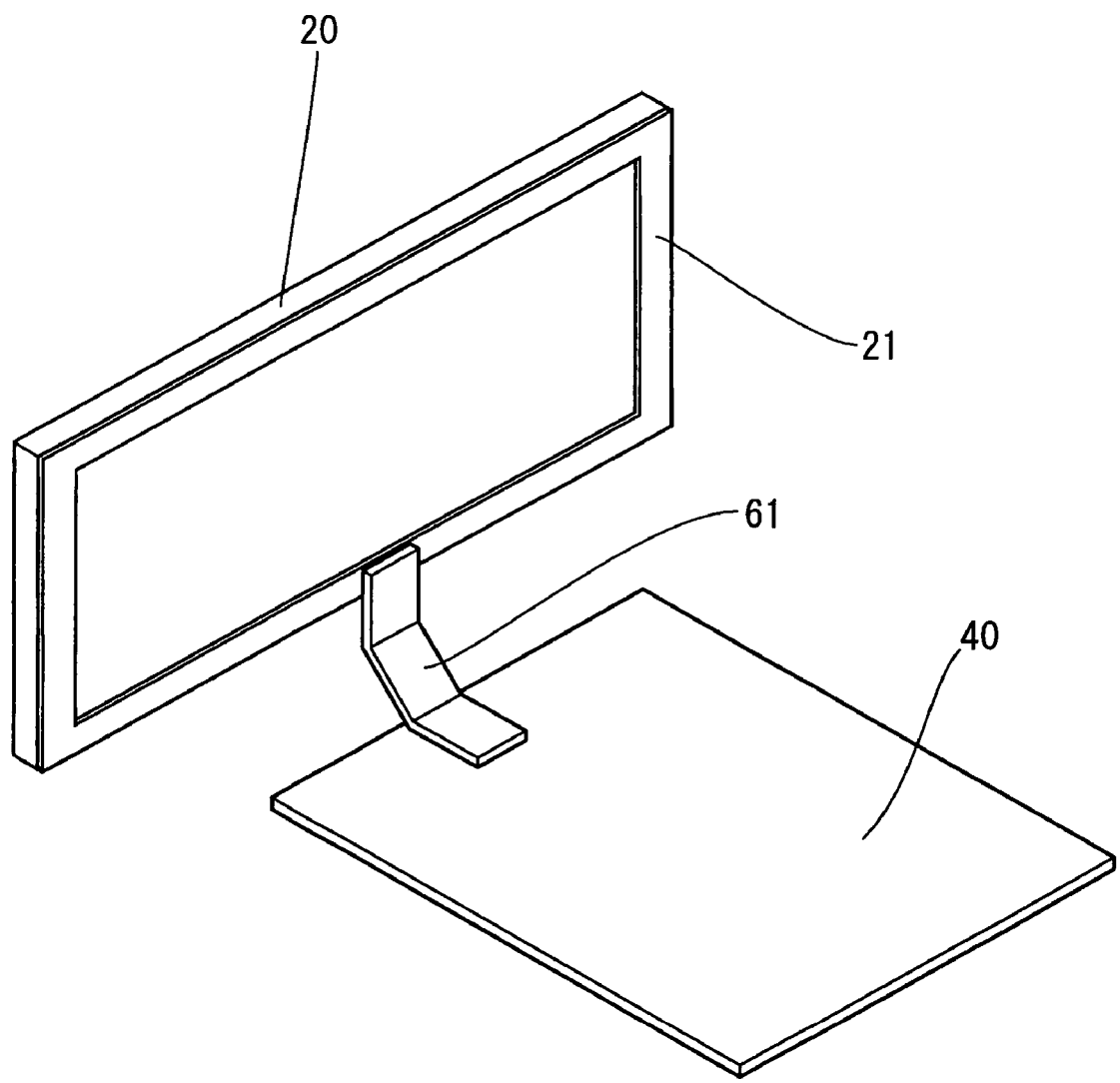
FIG. 7 is an explanatory view showing a prior art conduction method in which a conductive component is adhered to the half mirror.

The elastic conductive member 30 illustrated in FIGS. 4 and 5 has, as shown in FIG. 4, a conductive two-sided adhesive tape or a conductive adhesive paste 32 applied on one end thereof being the contact/conduction plane. The elastic conductive member 30 inserted to the through hole 23 formed to the decorative panel 22 as shown in FIG. 5 is attached and fixed at compressed state to the vapor deposited layer 21 of the half mirror 20 by the conductive two-sided adhesive tape or conductive adhesive paste 32, according to which the static electricity charged in the half mirror 20 can be conducted without fail from the vapor deposition layer 21 via the conductive two-sided adhesive tape or conductive adhesive paste 32 and the elastic conductive member 30. Moreover, even if the electronic device 10 is vibrated, it is possible to prevent the connection from being disconnected by the displacement of the elastic conductive member 30 or the like, since the elastic conductive member 30 is adhered to the vapor deposited layer 21 of the half mirror 20.

Next, a mounting board having conductivity that is separate from the conductive chassis is described with reference to FIGS. 4 and 5.

Reference number 41 of FIG. 5 denotes a mounting panel 41 having conductivity formed separately from the conductive chassis 40. The conductive mounting panel 41 is connected to the conductive chassis 40, and has an electronic component 50 which is an external connecting terminal such as a jack terminal mounted thereto. A contact surface 42 with the elastic conductive member 30 is formed to a portion of the mounting panel 41. Thus, there is no need to provide a conductive electronic component 61 or the like just to form a contact surface 42 with the elastic conductive member 30. Furthermore, on the front side of the conductive mounting panel 41 is a through hole 23 formed to the decorative panel 22 and a guide panel 24 projected toward the mounting panel 41 from the through hole 23. Further, a half mirror 20 is arranged on a front face of the decorative panel 22 having the through hole 23 and the guide panel 24, and on the inner face of the half mirror 20 is disposed a vapor deposited layer 21. As shown in FIG. 4, one end of the elastic conductive member 30 is attached and fixed in compressed state to the vapor deposited layer 21 of the half mirror 20 via a conductive two-sided adhesive tape or a conductive adhesive paste 32. Moreover, as shown in FIG. 5, the other end of the elastic conductive member 30 is pressed against the conductive mounting panel 41. Thereby, the static electricity charged in the half mirror 20 can be conducted without fail via the vapor deposited layer 21, the conductive two-sided adhesive tape or conductive adhesive paste 32, the elastic conductive member 30 and the conductive mounting panel 41 to the conductive chassis 40.

Now, the relative position of the mounting panel having conductivity and the elastic conductive member is described with reference to FIG. 5.

In FIG. 5, when the elastic conductive member 30 is made to be in contact with the conductive mounting panel 41, by arranging the elastic conductive member using the end of the mounting panel 41 as the contact surface 42 and having a portion of the elastic conductive member 30 overhang partially from the end of the mounting panel 41, the overhang portion of the elastic conductive member 30 in compressed state will not be in contact with the contact surface 42 and thus will not be compressed. Therefore, when the elastic conductive member 30 is compressed by the mounting panel 41, the portion of the member 30 being in contact with the contact surface 42 is compressed but the overhang portion is not compressed, so that the elastic conductive member 30 is deformed in an arc shape toward the specific side that is not compressed. Thereby, it is possible to prevent the elastic conductive member 30 from being deformed in other directions and contacting the electronic component 50 such as an external connecting terminal arranged close to the contact surface 42 of the mounting panel 41. Further, a guide panel 24 is arranged on the through hole 23 of the decorative panel 22, blocking the area in which the elastic conductive member 30 is deformed in an arc by the inner rim of the through hole 23 and the inner surface of the guide panel 24, and suppressing excessive deformation of the elastic conductive member 30. Moreover, the portion of the elastic conductive member 30 hanging over from the contact surface 42 and not being compressed (or the portion looking swollen) is arranged in the inner side of the electronic device 10 from the mounting panel 41, so that by visually observing the size of the swollen portion, it is possible to simply visually confirm whether the compressed contact status is appropriate or not since the swollen portion indicates how much the elastic conductive member 30 is compressed.

As described, according to the present embodiment, the electronic device having a half mirror on the front face according to the first embodiment of the invention includes a conductive chassis 40, a decorative panel 22 and a half mirror 20 disposed on the front face thereof, wherein a soft elastic conductive member 30 having a length somewhat longer than the distance between the half mirror 20 and the conductive chassis 40 is disposed in compressed state through a through hole 23 formed to the decorative panel 22 in the space between a vapor deposited layer 21 formed to the inner side of the half mirror 20 and a contact surface 42 of the conductive chassis 40, so that the repulsive force of the compressed elastic conductive member 30 realizes a secure connection between the vapor deposited layer 21 of the half mirror 20 and the contact surface 42 of the conductive chassis 40. Moreover, by having the static electricity charged in the half mirror 20 conducted through the elastic conductive member 30 to the conductive chassis 40, it is possible to prevent static electricity from being charged in the half mirror 20, and thus is possible to prevent the burn of the vapor deposited layer 21 of the half mirror 20. Furthermore, there is no need to control the length of the elastic conductive member 30 strictly, as long as it is somewhat longer than the distance between the half mirror 20 and the conductive chassis 40. According to the present embodiment, there is no need to especially prepare a conductive member 61 between the conductive chassis 40 and the metallic tape 60 as in the prior art example disclosed in patent document 1 using the metallic tape 60, so there is no need to restrict the location of the metallic tape 60 to the area of the conductive member 61 between the half mirror 20 and the conductive chassis 40. Furthermore, since the present invention utilizes a soft elastic conductive member 30, there is no need to consider a means to prevent the vapor deposited layer 21 from being damaged by friction or the like of the conductive member 61 disclosed in patent document 1 being in direct contact with the conductive chassis 40. Of course, unlike the other prior art examples where a hard metallic electric conductor is directly in contact with and connected to the half mirror 20, there is no need to provide a narrow gap (very narrow, approximately 0.2 mm) between the metallic electric conductor and the half mirror 20 to prevent damage to the half mirror 20, so there is no need to strictly control the size of the metallic electric conductor so as to suppress dispersion of the gap distance. Moreover, there is no need according to the present invention to minimize the surface roughness of the contact surface of the metallic electric conductor coming into contact with the vapor deposited layer 21 of the half mirror 20, and there is no need to take extra care in assembling the conductor and the half mirror so as to prevent scratches and bumps from being created on the vapor deposited surface of the half mirror 20.

As for the relationship between the planar area 20a of the half mirror 20 and the contact area of the elastic conductive member 30 and the half mirror 20, the area ratio of the elastic conductive member 30 to the half mirror 20 should be approximately 5% or greater, preferably around 9% considering the assembly work of the elastic conductive member 30.

According to the second embodiment of the present invention, the electronic device having a half mirror on the front face includes a decorative panel 22 having a through hole 23 for the elastic conductive member 30, the through hole 23 having a guide panel 24 composed of a pair of side walls 25 projected toward the conductive chassis 40 and a longer projected upper wall 26, enabling the elastic conductive member 30 to be pinched using fingers from the side wall area 25 and inserted to the through hole 23 using the side walls 25 and the upperwall 26 as positioning guides. Moreover, the end of the elastic conductive member 30 can be adhered and attached securely to the vapor deposited layer 21 of the half mirror 20 using a conductive two-sided adhesive tape or conductive adhesive paste 32.

Furthermore, the contact surface is composed of a mounting panel 41 having conductivity formed either integrally with or separately from the conductive chassis 40, the conductive mounting panel 41 having mounted thereto an electronic component 50 such as an external connecting terminal, so that by having the elastic conductive member 30 pressed against the contact surface 42 of the mounting panel 41, the static electricity being charged in the half mirror 20 can be conducted via the conductive mounting panel 41 to the conductive chassis 40. Moreover, the conductive mounting panel 41 is a mounting panel for mounting an electronic component 50 such as an external terminal of the electronic device, and a portion of the mounting panel 41 can be designed to function as the contact surface 42, so there is no need to provide a conductive mounting panel 41 just for the purpose of conducting the static electricity charged in the half mirror 20, and there is no need to provide a conductive member 61 nearby as in the prior art example.

Even further, the elastic conductive member 30 pressed against the mounting panel 41 is disposed so that a portion of the elastic conductive member 30 is overhung from an end of the mounting panel 41 serving as the contact surface 42, so that in the compressed state the overhang portion of the elastic conductive member 30 expands and deforms in an arc toward the side not being compressed. Thus, the deforming direction of the elastic conductive member 30 can be specified, preventing the elastic conductive member 30 from being deformed in other directions and coming into contact with the external connecting terminal 50 disposed close to the contact surface 41 on the mounting panel 41. Moreover, since a guide panel 24 is disposed on the through hole 23 of the decorative panel 22, the arc-like deformation of the elastic conductive member 30 can be blocked from further excessive deformation by the inner end of the through hole 23 and the inner surface of the guide panel 24. Moreover, the portion of the elastic conductive member 30 overhung from the contact surface 42 and not being compressed (or the portion looking swollen) is arranged in the inner side of the electronic device 10 from the mounting panel 41, so through visual observation of the size of the swollen portion, it is possible to simply visually confirm whether the compressed contact status is appropriate or not since the swollen portion indicates how much the elastic conductive member 30 is compressed.

The present embodiments have been described in detail, but the present invention is not restricted to the embodiments, and various changes can be made within the scope of the invention. For example, the elastic conductive member 30 should simply be in a state capable of being pressed against the conductive chassis 40 or the contact surface of the mounting plate 41, and the arrangement of the left and right side walls and the upper wall of the guide panel 24 formed to the through hole 23 of the decorative panel 22 can be changed appropriately to facilitate the assembly of the electronic device.

The effect of the present invention is as follows.

According to the first aspect of the present invention, the electronic device is equipped with a conductive chassis for mounting various electronic components, and a decorative panel formed on the front face of the chassis. Further, a portion of the decorative panel is formed of a half mirror, and a soft elastic conductive member is disposed in compressed state between a vapor deposited layer formed on an inner side of the half mirror and a contact surface of the chassis, so that by repulsive force of the compressed elastic conductive member, the vapor deposited layer of the half mirror and the contact surface of the chassis, which are somewhat spaced apart, can be connected without fail. Thus, the static electricity charged in the half mirror can be conducted via the elastic conductive member to the conductive chassis, so that the half mirror is prevented from being charged with static electricity, and the burning of the vapor deposited layer of the half mirror is prevented. Thus, unlike the prior art disclosed in patent document 1 using a metallic tape, there is no need to place a conductive member between the conductive chassis and the metallic tape, and the position for attaching the metallic tape is not limited to where the conductive member is disposed between the half mirror and the conductive chassis. Furthermore, unlike the method disclosed in patent document 1 related to directly connecting the conductive member in direct connection with the conductive chassis to the vapor deposited layer of the half mirror, there is no need to especially design the shape of the conductive member to prevent the vapor deposited layer from being damaged by scratches and the like, since the present invention utilizes a soft elastic conductive member. Moreover, unlike other prior art examples using a method of forming a pseudo-connection between the hard metallic electric conductor and the closely disposed half mirror, wherein a narrow gap is formed between the metallic electric conductor and the half mirror to prevent the half mirror from being damaged by the conductor, there is no need according to the present invention to strictly control the size of the metallic conductor to suppress the dispersion of gap width, to minimize the surface roughness of the contact surface of the metallic conductor coming into contact with the vapor deposited layer of the half mirror, and to take special care in assembling the conductor to prevent the vapor deposited layer of the half mirror from being scratched or damaged. Moreover, since according to the present invention the area ratio of the elastic conductive member to the half mirror is set to approximately 5% or greater, preferably 9% or greater, the conductivity required to conduct the static electricity charged in the half mirror to the conductive chassis can be ensured in proportion to the size of the half mirror, and thus, the burning of the vapor deposited layer of the half mirror can be prevented without fail.

According to the second aspect of the present invention, a through hole for the elastic conductive member is formed to the decorative panel, and a guide panel projected from the through hole toward the chassis along the direction of insertion of the elastic conductive member is provided, wherein the guide panel includes a pair of left and right side walls for supporting the sides of the elastic conductive member and an upper wall projected longer toward the chassis than the side walls, thereby enabling the elastic conductive member to be pinched from the side wall area and inserted to the through hole using the guide panel as a positioning guide, with the guide panel preventing the elastic conductive member from being displaced in the vertical and horizontal directions. Furthermore, the end of the elastic conductive member is adhered securely to the vapor deposited layer of the half mirror by a conductive two-sided adhesive tape or conductive adhesive paste.

According to the third aspect of the present invention, the contact surface is composed of a conductive mounting panel formed either integrally with the chassis or separately from the chassis and connected thereto, the mounting panel capable of mounting an electronic component such as an external connecting terminal, allowing the elastic conductive member to be pressed against the contact surface of the mounting panel to thereby conduct the static electricity charged in the half mirror toward the conductive chassis. Furthermore, the mounting panel having conductivity is the mounting panel for mounting electronic components such as the external terminal of the electronic device, so a portion of the mounting panel can also serve as the contact surface, and there is no need to provide a conductive mounting panel just for the purpose of conducting the static electricity charged in the half mirror, and there is no need as in the prior art example to arrange a conductive member nearby.

According to the fourth aspect of the invention, the elastic conductive member is disposed so that when it is pressed against the mounting panel, it is partially overhung from an end of the mounting panel, so that the overhang portion of the compressed elastic conductive member is out of range of the contact surface and thus not compressed. Therefore, when the elastic conductive member is compressed by the mounting panel, the area in contact with the contact surface is compressed, but the overhang area is not compressed, so that the overhang portion is deformed in an arc toward a specific direction. Thus, it is possible to prevent the elastic conductive member from being deformed in an unspecific direction and coming into contact with the external connection terminal positioned close to the contact surface on the mounting panel. Moreover, since the through hole of the decorative panel is provided with a guide panel, the space in which the elastic conductive member is deformed in an arc is blocked by the inner edge of the through hole and the inner side of the guide panel, so the elastic conductive member is prevented from being deformed excessively. Furthermore, the overhang portion of the elastic conductive member which is not compressed by the contact surface and looking swollen is positioned in an inner side of the electronic device from the mounting panel, so it is possible to estimate by visually confirming the size of the swollen portion how much the elastic conductive member is compressed, and it is possible to easily determine whether the conductive member is suitably compressed or not through visual observation.

What is claimed is:

1. An electronic device having a half mirror on a front face comprising:
    a conductive chassis for mounting various electronic components;
    a decorative panel disposed on a front face of the chassis, at least a portion of the decorative panel formed of a half mirror;
    an elastic conductive member compressed between and in contact with a vapor deposited layer formed on an inner side of the half mirror and a contact surface of the chassis, the elastic conductive member arranged so that a static electricity charged in the half mirror is conducted via the elastic conductive member to the conductive chassis, and wherein the area ratio of the elastic conductive member to the half mirror is approximately 5% or greater, preferably 9% or greater.

2. The electronic device having a half mirror on a front face according to claim 1, wherein the decorative panel has a through hole for the elastic conductive member and a guide panel projected from the through hole toward the chassis, wherein the guide panel is formed of a pair of left and right side walls for supporting left and right sides of the elastic conductive member and an upper wall projected longer toward the chassis than the side walls, and wherein the elastic conductive member passed through the through hole is adhered to the vapor deposited layer of the half mirror via a conductive two-sided adhesive tape or a conductive adhesive paste.

3. The electronic device having a half mirror on a front face according to claim 2, wherein the contact surface is composed of a conductive mounting panel formed either integrally with the chassis or separately from the chassis and connected thereto, the mounting panel capable of mounting an electronic component such as an external connecting terminal, and wherein the elastic conductive member is pressed against the mounting panel to conduct the static electricity charged in the half mirror to the conductive chassis.

4. The electronic device having a half mirror on a front face according to claim 3, wherein when the elastic conductive member is pressed against the mounting panel, a portion of the elastic conductive member is partially overhung from an end of the mounting panel, and a compressed end of the compressed elastic conductive member is positioned in an inner side of the electronic device from the mounting panel.

5. The electronic device having a half mirror on a front face according to claim 1, wherein the contact surface is composed of a conductive mounting panel formed either integrally with the chassis or separately from the chassis and connected thereto, the mounting panel capable of mounting an electronic component such as an external connecting terminal, and wherein the elastic conductive member is pressed against the mounting panel to conduct the static electricity charged in the half mirror to the conductive chassis.

6. The electronic device having a half mirror on a front face according to claim 5, wherein when the elastic conductive member is pressed against the mounting panel, a portion of the elastic conductive member is partially overhung from an end of the mounting panel, and a compressed end of the compressed elastic conductive member is positioned in an inner side of the electronic device from the mounting panel.

* * * * *